(12) United States Patent
Park

(10) Patent No.: US 7,749,039 B2
(45) Date of Patent: Jul. 6, 2010

(54) ORGANIC LIGHT EMITTING DISPLAY DEVICE AND METHOD OF MANUFACTURING THE SAME

(75) Inventor: Jin Woo Park, Yongin-si (KR)

(73) Assignee: Samsung Mobile Display Co., Ltd. (KR)

( * ) Notice: Subject to any disclaimer, the term of this patent is extended or adjusted under 35 U.S.C. 154(b) by 838 days.

(21) Appl. No.: 11/540,004

(22) Filed: Sep. 29, 2006

(65) Prior Publication Data

US 2007/0247068 A1 Oct. 25, 2007

(30) Foreign Application Priority Data

Apr. 20, 2006 (KR) .................. 10-2006-0035710

(51) Int. Cl.
*H01J 9/24* (2006.01)

(52) U.S. Cl. ........................... 445/24; 313/512
(58) Field of Classification Search .............. 313/512; 445/24

See application file for complete search history.

(56) References Cited

U.S. PATENT DOCUMENTS

| | | | |
|---|---|---|---|
| 4,238,704 A | 12/1980 | Bonk et al. | |
| 5,881,945 A * | 3/1999 | Edwards et al. | 228/124.6 |
| 6,555,025 B1 | 4/2003 | Krupetsky et al. | |
| 6,603,254 B1 * | 8/2003 | Ando | 313/495 |
| 6,861,801 B2 * | 3/2005 | Kim et al. | 313/512 |
| 7,193,366 B2 * | 3/2007 | Tomimatsu et al. | 313/512 |
| 7,202,602 B2 * | 4/2007 | Anandan | 313/512 |
| 7,306,346 B2 * | 12/2007 | Fukuoka et al. | 313/512 |
| 7,317,281 B2 * | 1/2008 | Hayashi et al. | 313/512 |

(Continued)

FOREIGN PATENT DOCUMENTS

JP 09-278483 10/1997

(Continued)

*Primary Examiner*—Peter Macchiarolo
(74) *Attorney, Agent, or Firm*—Knobbe Martens Olson & Bear LLP

(57) ABSTRACT

An organic light emitting display device and a method of manufacturing the same are disclosed. One aspect of the invention provides an organic light emitting display device including a first substrate including a pixel region in which an organic light emitting diode is formed, and a non-pixel region, the organic light emitting diode composed of a first electrode, an organic thin film layer and a second electrode; a second substrate arranged on the first substrate; a first encapsulating material provided between the first substrate and the second substrate of the non-pixel region; and a second encapsulating material provided in at least one side of the first encapsulating material and for reinforcing the first encapsulating material. The first encapsulating material includes at least one of a transparent glass layer and an opaque glass layer. The second encapsulating material includes a transparent glass layer and a reinforcement material, and a sealing substrate is connected with the substrate using the opaque glass layer and the reinforcement material. The organic light emitting display device may be useful to prevent Newton's rings from occurring by easily controlling a gap between a sealing substrate and the substrate in which an organic light emitting diode is formed by controlling a height of a transparent glass layer, and to use a low energy of a laser by adhering to the substrate by means of the opaque glass layer and the reinforcement material, which are applied onto the transparent glass layer.

23 Claims, 8 Drawing Sheets

U.S. PATENT DOCUMENTS

| | | | |
|---|---|---|---|
| 7,642,642 B2 * | 1/2010 | Fazzio | 257/704 |
| 2003/0066311 A1 * | 4/2003 | Li et al. | 65/43 |
| 2004/0207314 A1 | 10/2004 | Aitken et al. | |
| 2005/0110389 A1 * | 5/2005 | Kijima et al. | 313/495 |
| 2006/0103301 A1 * | 5/2006 | Spencer et al. | 313/512 |
| 2007/0170605 A1 * | 7/2007 | Lee et al. | 264/1.1 |
| 2007/0170861 A1 * | 7/2007 | Lee et al. | 313/512 |
| 2007/0176550 A1 * | 8/2007 | Kwan | 313/512 |
| 2007/0232182 A1 * | 10/2007 | Park | 313/512 |
| 2007/0267972 A1 * | 11/2007 | Menegus et al. | 313/512 |
| 2008/0106194 A1 * | 5/2008 | Logunov et al. | 313/512 |

FOREIGN PATENT DOCUMENTS

| | | |
|---|---|---|
| JP | 10-074583 | 3/1998 |
| KR | 10-2004-0002956 A | 1/2004 |
| WO | WO 03/005774 | 1/2003 |

* cited by examiner

ORGANIC LIGHT EMITTING DISPLAY DEVICE AND METHOD OF MANUFACTURING THE SAME

CROSS-REFERENCE TO RELATED APPLICATION

This application claims the benefit of Korean Patent Application No. 10-2006-0035710, filed on Apr. 20, 2006, in the Korean Intellectual Property Office, the disclosure of which is incorporated herein by reference.

BACKGROUND

1. Field

The present invention relates to an organic light emitting display device and a method of manufacturing the same, and more specifically to packaging of an organic light emitting display device.

2. Description of the Related Technology

Generally, an organic light emitting display device includes a substrate, a container opposing the substrate, and a sealant. The sealant combines the substrate and the container, which together form an enclosed space. The sealant is often made of a material such as epoxy. The organic light emitting display device further includes an array of pixels within the enclosed space.

The array includes a plurality of scan lines and data lines crossing each other; and a plurality of pixels connected between the scan lines and the data lines in a matrix pattern. Each pixel includes an anode electrode; a cathode electrode; and an organic thin film layer formed between the anode electrode and the cathode electrode. The organic thin film layer includes a hole transport layer, an organic emitting layer and an electron transport layer.

However, the organic light emitting display described above may be vulnerable to moisture since it includes organic substances in the array. In addition, one or more electrically conductive lines formed in the array are made of metallic materials, and thus the lines may be easily oxidized by oxygen contained in the air. Thus, its electrical and light-emitting properties may be deteriorated. To prevent this, moisture absorbent can be mounted within the enclosed space as an approach.

However, mounting the moisture absorbent in the display device is not without problems. As an alternative or in addition, more hermetic sealing can be introduced using glass frit substituting a convention al sealant. U.S. Pat. No. 6,998,776 discloses glass frit to encapsulate an organic light-emitting display device.

SUMMARY OF CERTAIN INVENTIVE ASPECTS

One aspect of the invention provides an organic light emitting display device. The device comprises: a first substrate; a second substrate arranged over the first substrate; an array of organic light emitting pixels interposed between the first and second substrates; a frit seal interposed between the first and second substrates while surrounding the array; and a reinforcing structure interconnecting the first and second substrates, the reinforcing structure comprising a first portion connecting to the first substrate and a second portion connecting to the second substrate, wherein the first and second portions are made of different materials.

The device may be configured to display images on the second substrate, and the second portion may be substantially transparent. The second portion may be made of substantially the same material as the frit seal. The second portion may be made of a frit material.

The array may be formed on the first substrate, and the first portion may be substantially opaque. The first portion may comprise a resin. The first portion may be made of a non-frit material. The first portion may be substantially opaque and has a height in a direction perpendicular to a display surface of the device, and the height may be from about 3 to about 50 µm. The second portion may be substantially transparent and has a height in a direction perpendicular to a display surface of the device, and the height may be from about 5 to about 100 µm.

The reinforcing structure may substantially surround the frit seal. The frit seal may surround the reinforcing structure. The frit seal may contact the reinforcing structure. The frit seal and the reinforcing structure may form a gap therebetween, and the gap may extend along the frit seal while surrounding the array.

The reinforcing structure may surround the array. The frit seal may surround the reinforcing structure, and the device may further comprise another reinforcing structure substantially surrounding the frit seal while interconnecting the first and second substrates. The other reinforcing structure may comprise a first portion connecting to the first substrate and a second portion connecting to the second substrate, and the first portion may be substantially opaque. The second portion of the other reinforcing structure may be substantially transparent.

The frit seal may comprise a first portion connecting to the first substrate and a second portion connecting to the second substrate. The first portion of the frit seal may be substantially opaque, and the second portion of the frit seal may be substantially transparent.

The first portion of the frit seal may have a first thickness and the second portion of the frit seal may have a second thickness. The first and second thicknesses are measured in a direction parallel to a display surface of the device, and the second thickness may be greater than the first thickness.

Another aspect of the invention provides a method of making an organic light emitting display device. The method comprises: providing a first substrate, an array of organic light emitting pixels and a second substrate, wherein the array is formed on the first substrate; arranging and interconnecting the first and second substrates with a frit such that the first substrate, the second substrate and the frit form an enclosed space and that the frit surrounds the array; and forming a reinforcing structure interconnecting the first and second substrates, the reinforcing structure comprising a first portion connecting to the first substrate and a second portion connecting to the second substrate, wherein the first portion is substantially opaque, and wherein the first and second portions are made of different materials.

Forming the reinforcing structure may comprise: forming the second portion on the second substrate using a frit material; and forming a first portion between the second portion and the first substrate such that the first portion bonds to the first substrate and the second portion. Forming the first portion may comprise: forming a resin on the second portion; interposing the resin between the first substrate and the second portion; and plasticizing at least part of the resin and then solidifying the resin so as to bond the resin to the first substrate. Forming the first portion may comprise forming a material for the first portion on the second portion using screen printing or nozzle dispensing of the material.

Another aspect of the invention provides an organic light emitting display device capable of preventing a Newton ring from occurring due to a path difference of the reflected light; and a method of manufacturing the same.

Another aspect of the invention provides an organic light emitting display device capable of connecting a sealing substrate to a substrate in which a light emitting element is formed using a low energy of a laser; and a method of manufacturing the same.

Another aspect of the invention provides an organic light emitting display device including a first substrate including a pixel region in which an organic light emitting diode is formed, and a non-pixel region, the organic light emitting diode composed of a first electrode, an organic thin film layer and a second electrode; a second substrate arranged on the first substrate; a first encapsulating material provided between the first substrate and the second substrate of the non-pixel region; and a second encapsulating material provided in at least one side of the first encapsulating material and for reinforcing the first encapsulating material, wherein the first encapsulating material is composed of at least one of a transparent glass layer and an opaque glass layer, and the second encapsulating material is composed of a transparent glass layer and a reinforcement material.

Yet another aspect of the invention provides a method for manufacturing an organic light emitting display device, including steps of forming, on a first substrate, an organic light emitting diode composed of a first electrode, an organic thin film layer and a second electrode; forming a first transparent glass layer along an edge of a second substrate, and forming a second transparent glass layer in at least one side of the first transparent glass layer; forming an opaque glass layer on the first transparent glass layer; applying a reinforcement material onto the second transparent glass layer; coalescing the first substrate into the second substrate; curing the reinforcement material; and adhering the opaque glass layer to the substrate by irradiating a laser or an infrared ray.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF CERTAIN INVENTIVE EMBODIMENTS

Figure 1A:
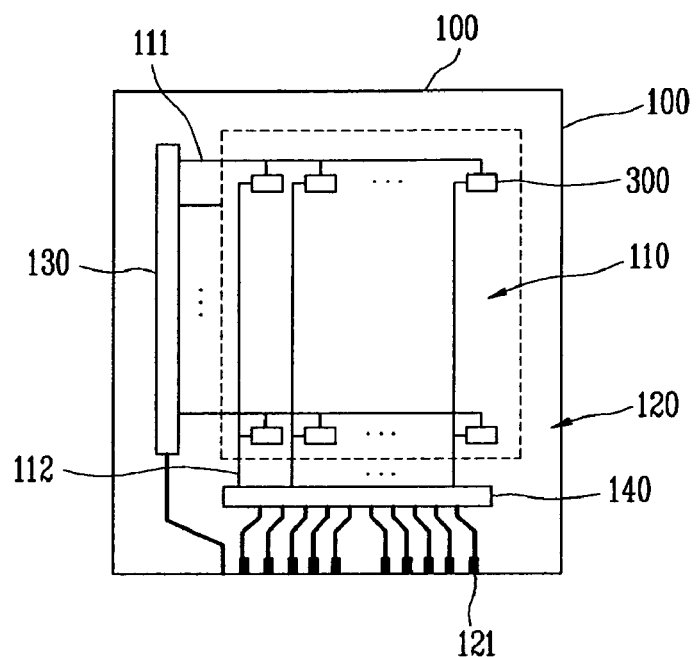
FIG. 1A, FIG. 2A and FIG. 3 are plan views showing an organic light emitting display device according to one embodiment.

Hereinafter, embodiments according to the invention will be described with reference to the accompanying drawings. In the drawings, like reference numerals indicate identical or functionally similar elements throughout.

An organic light emitting display (OLED) is a display device comprising an array of organic light emitting diodes. Organic light emitting diodes are solid state devices which include an organic material and are adapted to generate and emit light when appropriate electrical potentials are applied.

Figure 6A:
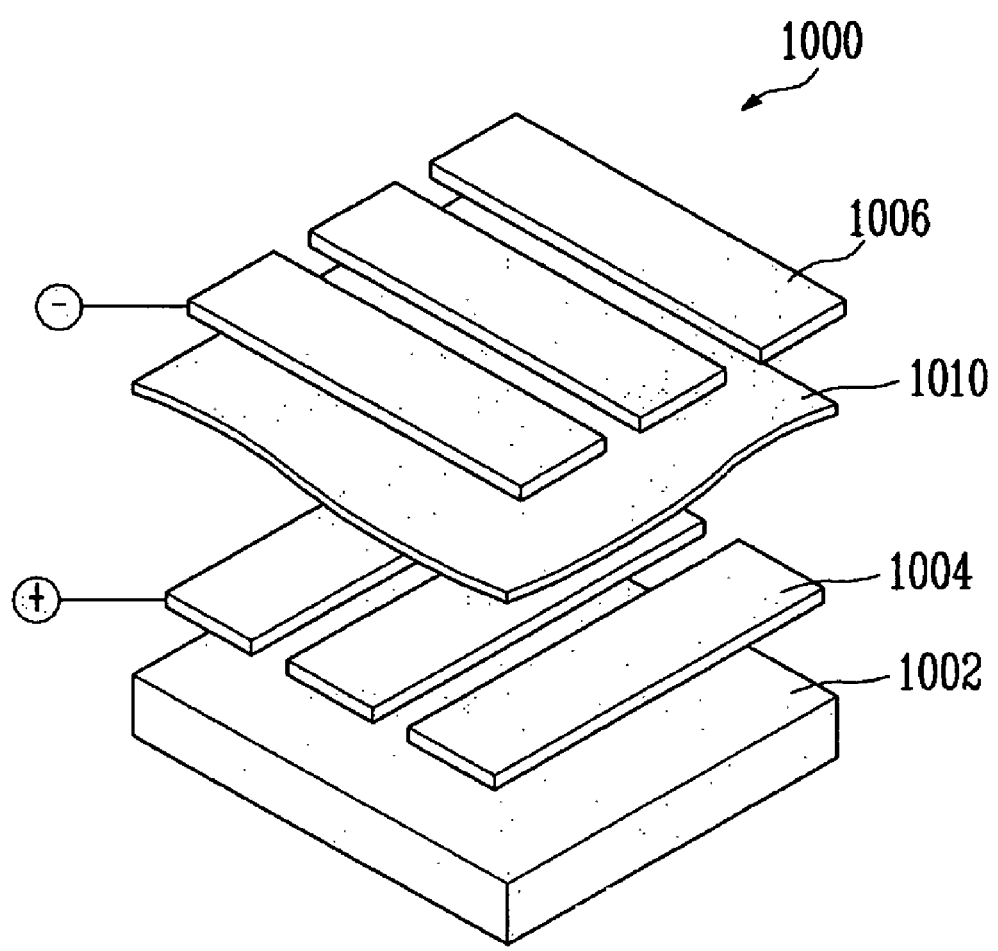
FIG. 6A is a schematic exploded view of a passive matrix type organic light emitting display device in accordance with one embodiment.
Figure 6B:
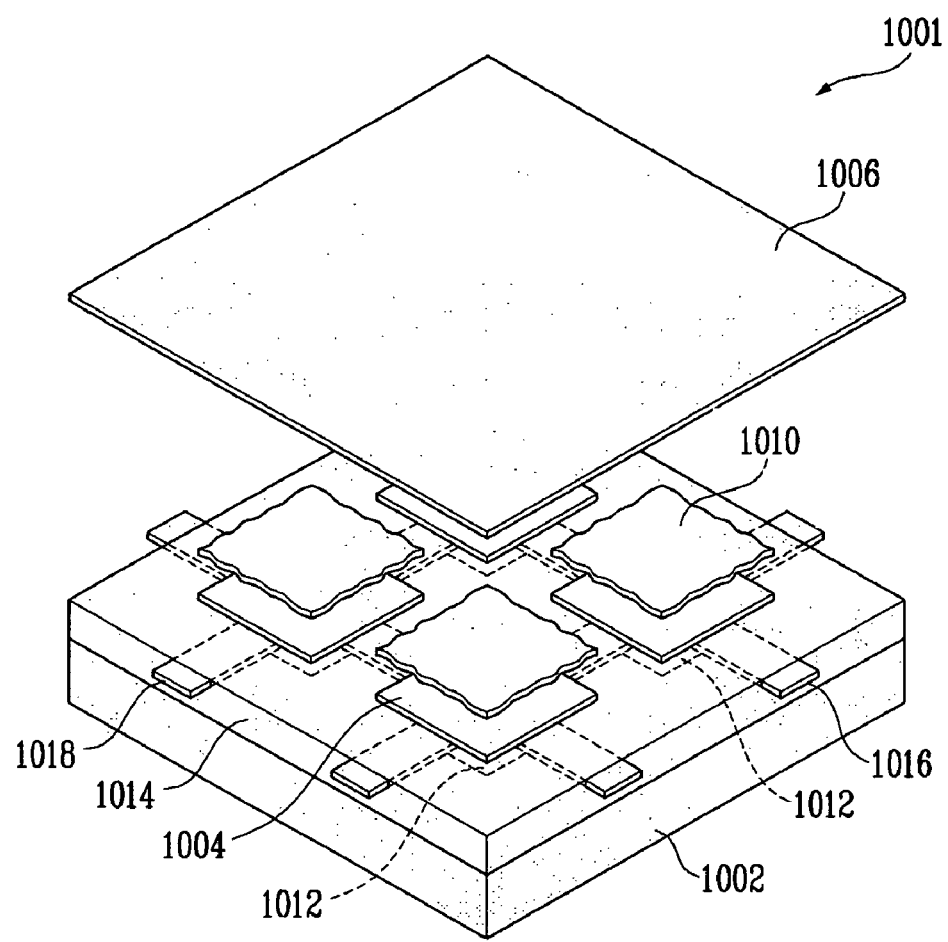
FIG. 6B is a schematic exploded view of an active matrix type organic light emitting display device in accordance with one embodiment.

OLEDs can be generally grouped into two basic types dependent on the arrangement with which the stimulating electrical current is provided. FIG. 6A schematically illustrates an exploded view of a simplified structure of a passive matrix type OLED 1000. FIG. 6B schematically illustrates a simplified structure of an active matrix type OLED 1001. In both configurations, the OLED 1000, 1001 includes OLED pixels built over a substrate 1002, and the OLED pixels include an anode 1004, a cathode 1006 and an organic layer 1010. When an appropriate electrical current is applied to the anode 1004, electric current flows through the pixels and visible light is emitted from the organic layer.

Referring to FIG. 6A, the passive matrix OLED (PMOLED) design includes elongate strips of anode 1004 arranged generally perpendicular to elongate strips of cathode 1006 with organic layers interposed therebetween. The intersections of the strips of cathode 1006 and anode 1004 define individual OLED pixels where light is generated and emitted upon appropriate excitation of the corresponding strips of anode 1004 and cathode 1006. PMOLEDs provide the advantage of relatively simple fabrication.

Referring to FIG. 6B, the active matrix OLED (AMOLED) includes local driving circuits 1012 arranged between the substrate 1002 and an array of OLED pixels. An individual pixel of AMOLEDs is defined between the common cathode 1006 and an anode 1004, which is electrically isolated from other anodes. Each driving circuit 1012 is coupled with an anode 1004 of the OLED pixels and further coupled with a data line 1016 and a scan line 1018. In embodiments, the scan lines 1018 supply scan signals that select rows of the driving circuits, and the data lines 1016 supply data signals for particular driving circuits. The data signals and scan signals stimulate the local driving circuits 1012, which excite the anodes 1004 so as to emit light from their corresponding pixels.

In the illustrated AMOLED, the local driving circuits 1012, the data lines 1016 and scan lines 1018 are buried in a planarization layer 1014, which is interposed between the pixel array and the substrate 1002. The planarization layer 1014 provides a planar top surface on which the organic light emitting pixel array is formed. The planarization layer 1014 may be formed of organic or inorganic materials, and formed of two or more layers although shown as a single layer. The local driving circuits 1012 are typically formed with thin film transistors (TFT) and arranged in a grid or array under the OLED pixel array. The local driving circuits 1012 may be at least partly made of organic materials, including organic TFT. AMOLEDs have the advantage of fast response time improving their desirability for use in displaying data signals. Also, AMOLEDs have the advantages of consuming less power than passive matrix OLEDs.

Referring to common features of the PMOLED and AMOLED designs, the substrate 1002 provides structural support for the OLED pixels and circuits. In various embodiments, the substrate 1002 can comprise rigid or flexible materials as well as opaque or transparent materials, such as plastic, glass, and/or foil. As noted above, each OLED pixel or diode is formed with the anode 1004, cathode 1006 and organic layer 1010 interposed therebetween. When an appropriate electrical current is applied to the anode 1004, the cathode 1006 injects electrons and the anode 1004 injects holes. In certain embodiments, the anode 1004 and cathode 1006 are inverted; i.e., the cathode is formed on the substrate 1002 and the anode is opposingly arranged.

Interposed between the cathode 1006 and anode 1004 are one or more organic layers. More specifically, at least one emissive or light emitting layer is interposed between the cathode 1006 and anode 1004. The light emitting layer may comprise one or more light emitting organic compounds. Typically, the light emitting layer is configured to emit visible light in a single color such as blue, green, red or white. In the illustrated embodiment, one organic layer 1010 is formed between the cathode 1006 and anode 1004 and acts as a light emitting layer. Additional layers, which can be formed between the anode 1004 and cathode 1006, can include a hole transporting layer, a hole injection layer, an electron transporting layer and an electron injection layer.

Hole transporting and/or injection layers can be interposed between the light emitting layer 1010 and the anode 1004. Electron transporting and/or injecting layers can be interposed between the cathode 1006 and the light emitting layer 1010. The electron injection layer facilitates injection of electrons from the cathode 1006 toward the light emitting layer 1010 by reducing the work function for injecting electrons from the cathode 1006. Similarly, the hole injection layer facilitates injection of holes from the anode 1004 toward the light emitting layer 1010. The hole and electron transporting layers facilitate movement of the carriers injected from the respective electrodes toward the light emitting layer.

In some embodiments, a single layer may serve both electron injection and transportation functions or both hole injection and transportation functions. In some embodiments, one or more of these layers are lacking. In some embodiments, one or more organic layers are doped with one or more materials that help injection and/or transportation of the carriers. In embodiments where only one organic layer is formed between the cathode and anode, the organic layer may include not only an organic light emitting compound but also certain functional materials that help injection or transportation of carriers within that layer.

There are numerous organic materials that have been developed for use in these layers including the light emitting layer. Also, numerous other organic materials for use in these layers are being developed. In some embodiments, these organic materials may be macromolecules including oligomers and polymers. In some embodiments, the organic materials for these layers may be relatively small molecules. The skilled artisan will be able to select appropriate materials for each of these layers in view of the desired functions of the individual layers and the materials for the neighboring layers in particular designs.

In operation, an electrical circuit provides appropriate potential between the cathode 1006 and anode 1004. This results in an electrical current flowing from the anode 1004 to the cathode 1006 via the interposed organic layer(s). In one embodiment, the cathode 1006 provides electrons to the adjacent organic layer 1010. The anode 1004 injects holes to the organic layer 1010. The holes and electrons recombine in the organic layer 1010 and generate energy particles called "excitons." The excitons transfer their energy to the organic light emitting material in the organic layer 1010, and the energy is used to emit visible light from the organic light emitting material. The spectral characteristics of light generated and emitted by the OLED 1000, 1001 depend on the nature and composition of organic molecules in the organic layer(s). The composition of the one or more organic layers can be selected to suit the needs of a particular application by one of ordinary skill in the art.

OLED devices can also be categorized based on the direction of the light emission. In one type referred to as "top emission" type, OLED devices emit light and display images through the cathode or top electrode 1006. In these embodiments, the cathode 1006 is made of a material transparent or at least partially transparent with respect to visible light. In certain embodiments, to avoid losing any light that can pass through the anode or bottom electrode 1004, the anode may be made of a material substantially reflective of the visible light. A second type of OLED devices emits light through the anode or bottom electrode 1004 and is called "bottom emission" type. In the bottom emission type OLED devices, the anode 1004 is made of a material which is at least partially transparent with respect to visible light. Often, in bottom emission type OLED devices, the cathode 1006 is made of a material substantially reflective of the visible light. A third type of OLED devices emits light in two directions, e.g. through both anode 1004 and cathode 1006. Depending upon the direction(s) of the light emission, the substrate may be formed of a material which is transparent, opaque or reflective of visible light.

Figure 6C:
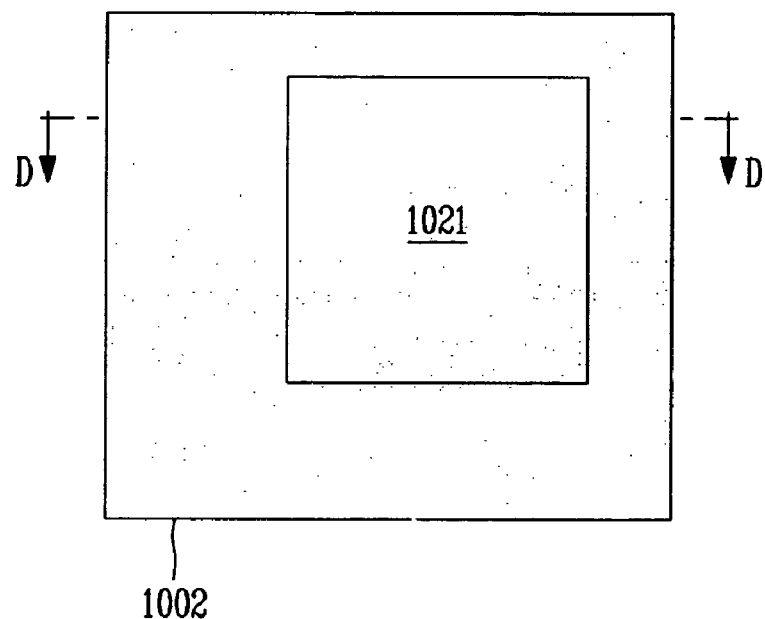
FIG. 6C is a schematic top plan view of an organic light emitting display in accordance with one embodiment.

In many embodiments, an OLED pixel array 1021 comprising a plurality of organic light emitting pixels is arranged over a substrate 1002 as shown in FIG. 6C. In embodiments, the pixels in the array 1021 are controlled to be turned on and off by a driving circuit (not shown), and the plurality of the pixels as a whole displays information or image on the array 1021. In certain embodiments, the OLED pixel array 1021 is arranged with respect to other components, such as drive and control electronics to define a display region and a non-display region. In these embodiments, the display region refers to the area of the substrate 1002 where OLED pixel array 1021 is formed. The non-display region refers to the remaining areas of the substrate 1002. In embodiments, the non-display region can contain logic and/or power supply circuitry. It will be understood that there will be at least portions of control/drive circuit elements arranged within the display region. For example, in PMOLEDs, conductive components will extend into the display region to provide appropriate potential to the anode and cathodes. In AMOLEDs, local driving circuits and data/scan lines coupled with the driving circuits will extend into the display region to drive and control the individual pixels of the AMOLEDs.

Figure 6D:
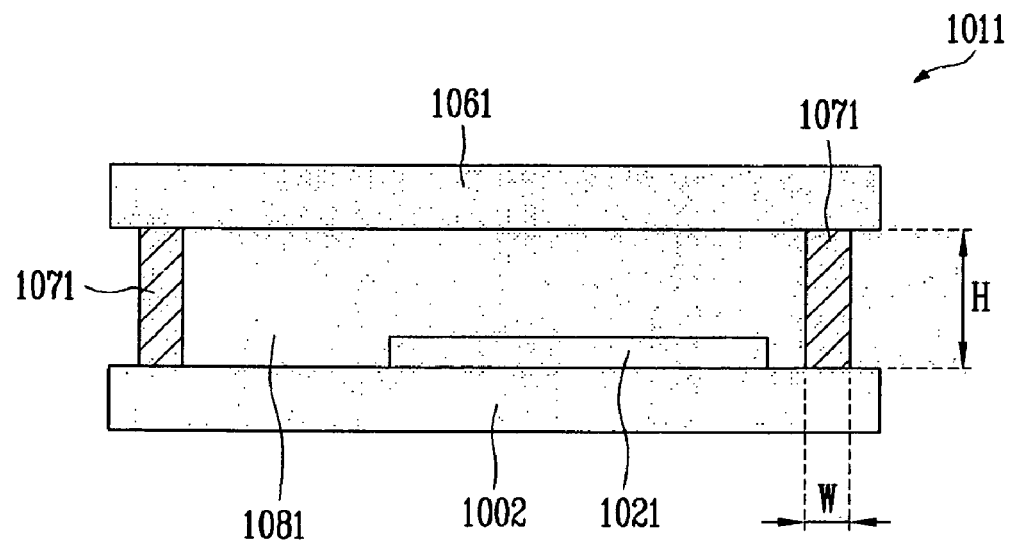
FIG. 6D is a cross-sectional view of the organic light emitting display of FIG. 6C, taken along the line d-d.

One design and fabrication consideration in OLED devices is that certain organic material layers of OLED devices can suffer damage or accelerated deterioration from exposure to water, oxygen or other harmful gases. Accordingly, it is generally understood that OLED devices be sealed or encapsulated to inhibit exposure to moisture and oxygen or other harmful gases found in a manufacturing or operational environment. FIG. 6D schematically illustrates a cross-section of an encapsulated OLED device 1011 having a layout of FIG. 6C and taken along the line d-d of FIG. 6C. In this embodiment, a generally planar top plate or substrate 1061 engages with a seal 1071 which further engages with a bottom plate or substrate 1002 to enclose or encapsulate the OLED pixel array 1021. In other embodiments, one or more layers are formed on the top plate 1061 or bottom plate 1002, and the seal 1071 is coupled with the bottom or top substrate 1002, 1061 via such a layer. In the illustrated embodiment, the seal 1071 extends along the periphery of the OLED pixel array 1021 or the bottom or top plate 1002, 1061.

In embodiments, the seal 1071 is made of a frit material as will be further discussed below. In various embodiments, the top and bottom plates 1061, 1002 comprise materials such as plastics, glass and/or metal foils which can provide a barrier to passage of oxygen and/or water to thereby protect the OLED pixel array 1021 from exposure to these substances. In embodiments, at least one of the top plate 1061 and the bottom plate 1002 are formed of a substantially transparent material.

To lengthen the life time of OLED devices 1011, it is generally desired that seal 1071 and the top and bottom plates 1061, 1002 provide a substantially non-permeable seal to oxygen and water vapor and provide a substantially hermetically enclosed space 1081. In certain applications, it is indicated that the seal 1071 of a frit material in combination with the top and bottom plates 1061, 1002 provide a barrier to oxygen of less than approximately $10^{-3}$ cc/m$^2$-day and to water of less than $10^{-6}$ g/m$^2$-day. Given that some oxygen and moisture can permeate into the enclosed space 1081, in some embodiments, a material that can take up oxygen and/or moisture is formed within the enclosed space 1081.

The seal 1071 has a width W, which is its thickness in a direction parallel to a surface of the top or bottom substrate 1061, 1002 as shown in FIG. 6D. The width varies among embodiments and ranges from about 300 μm to about 3000 μm, optionally from about 500 μm to about 1500 μm. Also, the width may vary at different positions of the seal 1071. In some embodiments, the width of the seal 1071 may be the largest where the seal 1071 contacts one of the bottom and top substrate 1002, 1061 or a layer formed thereon. The width may be the smallest where the seal 1071 contacts the other. The width variation in a single cross-section of the seal 1071 relates to the cross-sectional shape of the seal 1071 and other design parameters.

The seal 1071 has a height H, which is its thickness in a direction perpendicular to a surface of the top or bottom substrate 1061, 1002 as shown in FIG. 6D. The height varies among embodiments and ranges from about 2 μm to about 30 μm, optionally from about 10 μm to about 15 μm. Generally, the height does not significantly vary at different positions of the seal 1071. However, in certain embodiments, the height of the seal 1071 may vary at different positions thereof.

In the illustrated embodiment, the seal 1071 has a generally rectangular cross-section. In other embodiments, however, the seal 1071 can have other various cross-sectional shapes such as a generally square cross-section, a generally trapezoidal cross-section, a cross-section with one or more rounded edges, or other configuration as indicated by the needs of a given application. To improve hermeticity, it is generally desired to increase the interfacial area where the seal 1071 directly contacts the bottom or top substrate 1002, 1061 or a layer formed thereon. In some embodiments, the shape of the seal can be designed such that the interfacial area can be increased.

The seal 1071 can be arranged immediately adjacent the OLED array 1021, and in other embodiments, the seal 1071 is spaced some distance from the OLED array 1021. In certain embodiment, the seal 1071 comprises generally linear segments that are connected together to surround the OLED array 1021. Such linear segments of the seal 1071 can extend, in certain embodiments, generally parallel to respective boundaries of the OLED array 1021. In other embodiment, one or more of the linear segments of the seal 1071 are arranged in a non-parallel relationship with respective boundaries of the OLED array 1021. In yet other embodiments, at least part of the seal 1071 extends between the top plate 1061 and bottom plate 1002 in a curvilinear manner.

As noted above, in certain embodiments, the seal 1071 is formed using a frit material or simply "frit" or glass frit," which includes fine glass particles. The frit particles includes one or more of magnesium oxide (MgO), calcium oxide (CaO), barium oxide (BaO), lithium oxide (Li$_2$O), sodium oxide (Na$_2$O), potassium oxide (K$_2$O), boron oxide (B$_2$O$_3$), vanadium oxide (V$_2$O$_5$), zinc oxide (ZnO), tellurium oxide (TeO$_2$), aluminum oxide (Al$_2$O$_3$), silicon dioxide (SiO$_2$), lead oxide (PbO), tin oxide (SnO), phosphorous oxide (P$_2$O$_5$), ruthenium oxide (Ru$_2$O), rubidium oxide (Rb$_2$O), rhodium oxide (Rh$_2$O), ferrite oxide (Fe$_2$O$_3$), copper oxide (CuO), titanium oxide (TiO$_2$), tungsten oxide (WO$_3$), bismuth oxide (Bi$_2$O$_3$), antimony oxide (Sb$_2$O$_3$), lead-borate glass, tin-phosphate glass, vanadate glass, and borosilicate, etc. In embodiments, these particles range in size from about 2 μm to about 30 μm, optionally about 5 μm to about 10 μm, although not limited only thereto. The particles can be as large as about the distance between the top and bottom substrates 1061, 1002 or any layers formed on these substrates where the frit seal 1071 contacts.

The frit material used to form the seal 1071 can also include one or more filler or additive materials. The filler or additive materials can be provided to adjust an overall thermal expansion characteristic of the seal 1071 and/or to adjust the absorption characteristics of the seal 1071 for selected frequencies of incident radiant energy. The filler or additive material(s) can also include inversion and/or additive fillers to adjust a coefficient of thermal expansion of the frit. For example, the filler or additive materials can include transition metals, such as chromium (Cr), iron (Fe), manganese (Mn), cobalt (Co), copper (Cu), and/or vanadium. Additional materials for the filler or additives include ZnSiO$_4$, PbTiO$_3$, ZrO$_2$, eucryptite.

In embodiments, a frit material as a dry composition contains glass particles from about 20 to 90 about wt %, and the remaining includes fillers and/or additives. In some embodiments, the frit paste contains about 10-30 wt % organic materials and about 70-90% inorganic materials. In some embodiments, the frit paste contains about 20 wt % organic materials and about 80 wt % inorganic materials. In some embodiments, the organic materials may include about 0-30 wt % binder(s) and about 70-100 wt % solvent(s). In some embodiments, about 10 wt % is binder(s) and about 90 wt % is solvent(s) among the organic materials. In some embodiments, the inorganic materials may include about 0-10 wt % additives, about 20-40 wt % fillers and about 50-80 wt % glass powder. In some embodiments, about 0-5 wt % is additive(s), about 25-30 wt % is filler(s) and about 65-75 wt % is the glass powder among the inorganic materials.

In forming a frit seal, a liquid material is added to the dry frit material to form a frit paste. Any organic or inorganic solvent with or without additives can be used as the liquid material. In embodiments, the solvent includes one or more organic compounds. For example, applicable organic compounds are ethyl cellulose, nitro cellulose, hydroxyl propyl cellulose, butyl carbitol acetate, terpineol, butyl cellusolve, acrylate compounds. Then, the thus formed frit paste can be applied to form a shape of the seal 1071 on the top and/or bottom plate 1061, 1002.

In one exemplary embodiment, a shape of the seal 1071 is initially formed from the frit paste and interposed between the top plate 1061 and the bottom plate 1002. The seal 1071 can in certain embodiments be pre-cured or pre-sintered to one of the top plate and bottom plate 1061, 1002. Following assembly of the top plate 1061 and the bottom plate 1002 with the seal 1071 interposed therebetween, portions of the seal 1071 are selectively heated such that the frit material forming the seal 1071 at least partially melts. The seal 1071 is then allowed to resolidify to form a secure joint between the top plate 1061 and the bottom plate 1002 to thereby inhibit exposure of the enclosed OLED pixel array 1021 to oxygen or water.

In embodiments, the selective heating of the frit seal is carried out by irradiation of light, such as a laser or directed infrared lamp. As previously noted, the frit material forming the seal 1071 can be combined with one or more additives or filler such as species selected for improved absorption of the irradiated light to facilitate heating and melting of the frit material to form the seal 1071.

Figure 6E:
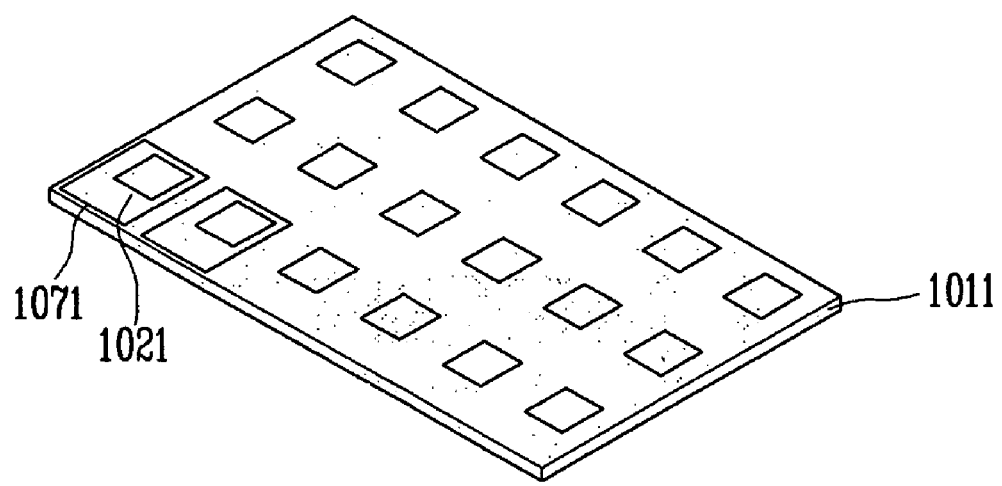
FIG. 6E is a schematic perspective view illustrating mass production of organic light emitting devices in accordance with one embodiment.

In some embodiments, OLED devices 1011 are mass produced. In an embodiment illustrated in FIG. 6E, a plurality of separate OLED arrays 1021 is formed on a common bottom substrate 1101. In the illustrated embodiment, each OLED array 1021 is surrounded by a shaped frit to form the seal 1071. In embodiments, common top substrate (not shown) is placed over the common bottom substrate 1101 and the structures formed thereon such that the OLED arrays 1021 and the shaped frit paste are interposed between the common bottom substrate 1101 and the common top substrate. The OLED arrays 1021 are encapsulated and sealed, such as via the previously described enclosure process for a single OLED display device. The resulting product includes a plurality of OLED devices kept together by the common bottom and top substrates. Then, the resulting product is cut into a plurality of pieces, each of which constitutes an OLED device 1011 of FIG. 6D. In certain embodiments, the individual OLED devices 1011 then further undergo additional packaging operations to further improve the sealing formed by the frit seal 1071 and the top and bottom substrates 1061, 1002.

In one embodiment, an organic light emitting display device includes a sealing substrate and a substrate in which a light emitting element is formed. The substrates may be encapsulated with a sealing structure interposed therebetween. The sealing structure may include a frit. The two substrates are spaced apart a fine distance by the sealing structure. When a light incident from the outside is reflected by the substrate and the sealing substrate, concentric patterns are formed on a surface of the substrate due to a path difference of the light, reducing the contrast ratio. The concentric rings are also referred to as "Newton's rings."

In one approach, an anti reflection coating is applied to a substrate having a surface on which an image is displayed. In another approach, a distance between a substrate and a sealing substrate is adjusted by reducing a thickness of the substrate using an etching process. However, these approaches have a disadvantage that its manufacturing cost increases since additional processes are required.

In yet another approach, a distance between a substrate and a sealing substrate may be adjusted by increasing the height of a frit side wall. However, in this case, there is a limitation in increasing the height of the side wall due to a limitation to a distance that a laser used for melting the frit penetrates. If a high power laser is used for melting such a frit side wall, the substrate may be subject to a stress due to a high temperature difference between a start point and an end point.

In one embodiment, an organic light emitting display device is configured to prevent Newton's rings from occurring while employing a low energy laser with a simple process; and a method of manufacturing the same.

Figure 1B:
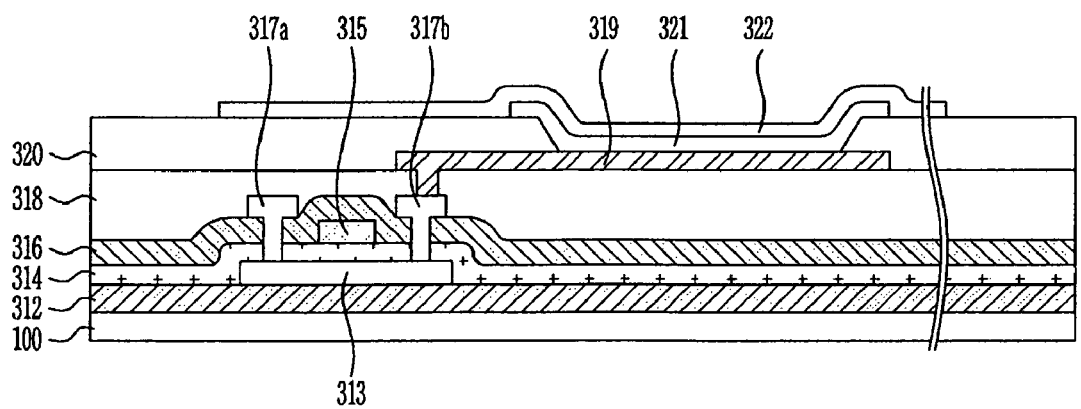
FIG. 1B and FIG. 2B are cross-sectional views of the organic light emitting display devices of FIG. 1A and FIG. 2A.
Figure 2A:
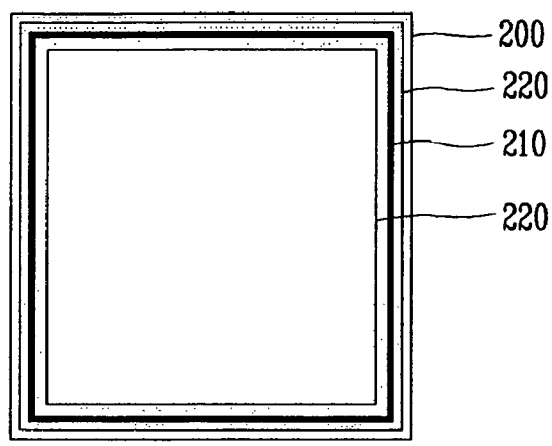
Figure 2B:
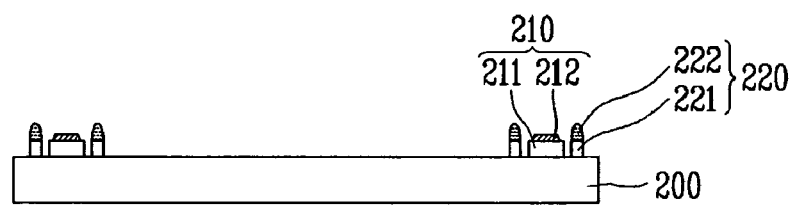
Figure 3:
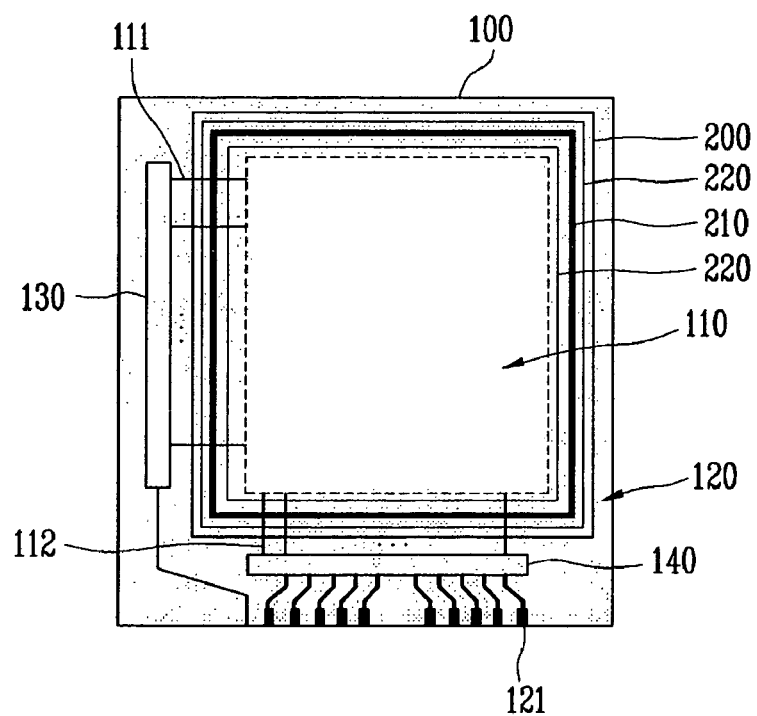

FIG. 1A, FIG. 2A and FIG. 3 are plan views showing an organic light emitting display device according to one embodiment. FIG. 1B and FIG. 2B are cross-sectional views of the organic light emitting display device of FIG. 1A and FIG. 2A, respectively.

Referring to FIGS. 1A and 1B, a substrate 100 includes a pixel region 110 and a non-pixel region 120. The non-pixel region 120 may be a circumferential region of the pixel region 110, or a region that surrounds the pixel region 110. In the pixel region 110 of the substrate 100, a plurality of organic light emitting diodes 300 are formed therein. The organic light emitting diodes 300 are connected between scan lines 111 and data lines 112 in a matrix pattern, forming pixels. In the non-pixel region 120 of the substrate 100, scan lines 111 and data lines 112 are formed therein, extending from the scan lines 111 and the data lines 112 of the pixel region 110. The non-pixel region 120 also includes a power voltage supply line (not shown) for operating the organic light emitting diodes 300. The non-pixel region 120 further includes a scan drive unit 130 and a data drive unit 140 for transmitting signals provided through a pad 121 from the outside. The signals are supplied to the scan line 111 and the data line 112.

The organic light emitting diode 300 includes an anode electrode 319, a cathode electrode 322, and an organic thin film layer 321 formed between the anode electrode 319 and the cathode electrode 322. The organic thin film layer 321 has a hole transport layer, an organic emitting layer and an electron transport layer which are laminated with one another. The organic emitting layer may further include a hole injection layer and an electron injection layer. The organic thin film layer 321 may further include a switching transistor for controlling the operation of the organic light emitting diode 300, and a capacitor for sustaining signals.

Referring to FIG. 2A and FIG. 2B, a sealing substrate 200 is arranged over the substrate so that it can be overlapped with the pixel region 110. The sealing substrate 200 may also cover at least a portion of the non-pixel region 120. A first encapsulating material 210 is provided along an edge of the sealing substrate 200 corresponding to the non-pixel region 120 of the substrate 100. A second encapsulating material 220 for reinforcing a first encapsulating material 210 may further be provided on the sealing substrate 200 on at least one side of the first encapsulating material 210. The first encapsulating material 210 is configured to block hydrogen, oxygen, or moisture from entering the pixel region 110, and is formed to surround the pixel region 110. The second encapsulating material 220 is formed spaced apart a predetermined distance from the first encapsulating material 210 on an inner and/or outer side of the first encapsulating material 210.

The first encapsulating material 210 includes at least one transparent glass layer 211 and an opaque glass layer 212 stacked over each other. In the illustrated embodiment, the transparent glass layer 211 is thicker and wider than the opaque glass layer 212. For example, the transparent glass layer 211 has a height of about 5 to about 100 μm, and the opaque glass layer 212 has a height of about 3 to about 30 μm. The opaque glass layer 212 may be in a rectangular shape having the same widths in lower and upper portions, or in a trapezoid shape having about 60 to about 100% of a top width when compared to a bottom width. The opaque glass layer 212 may be formed of a frit including materials that can be melted by a laser or an infrared ray. The frit may include at least one transition metal dopant.

The second encapsulating material 220 includes a transparent glass layer 221 and a reinforcement material 222 stacked over each other. The transparent glass layer 221 is thicker than the reinforcement material 222. For example, the transparent glass layer 221 has a height of about 5 to about 100 μm, and the reinforcement material 222 has a height of about 3 to about 50 μm. The reinforcement material 222 has good adhesion to the substrate 100, and is formed of a material that may relieve impacts applied from the outside and block hydrogen, oxygen, or moisture. For example, the reinforcement material may be a material that may be naturally cured, or cured using heat or UV. In one embodiment, epoxy may be used as a reinforcement material.

Referring to FIG. 3, the sealing substrate 200 and the substrate 100 are connected to each other using the opaque glass layer 212 and the reinforcement material 222. The sealing substrate 200 is arranged over the substrate 100 so that it is overlapped with the pixel region 110 and a portion of the non-pixel region 120. The reinforcement material 222 may be cured using UV. The opaque glass layer 212 may be melted using a laser or an infrared ray and then is bonded to the substrate 100.

Hereinafter, a method for manufacturing an organic light emitting display device according to one embodiment will be described in detail. Referring back to FIG. 1A and FIG. 1B, a substrate 100 has a pixel region 110 and a non-pixel region 120. The non-pixel region 120 may be a circumferential region of the pixel region 110, or a region that surrounds the pixel region 110. In the pixel region 110 of the substrate 100 are formed a plurality of organic light emitting diodes 300 connected between scan lines 111 and data lines 112 in a matrix pattern. Each of the organic light emitting diodes includes an anode electrode 319, an organic thin film layer 321 and a cathode electrode 322. In the non-pixel region 120 of the substrate 100 are formed scan lines 111 and data lines 112 extending from the scan lines 111 and the data lines 112 of the pixel region 110. The non-pixel region 120 also includes a power voltage supply line (not shown) for operating the organic light emitting diodes 300; a pad 121 for receiving signals from the outside; and a scan drive unit 130 and a data drive unit 140 for processing the signals provided from the outside through the pad 121 and supplying the signals to the scan line 111 and the data line 112.

Referring to FIG. 1B, first, a buffer layer 312 is formed on the substrate 100. The buffer layer 312 prevents the substrate 100 from being damaged by heat. The buffer layer 132 may be formed of insulation films such as a silicon oxide film (SiO$_2$) or a silicon nitride film (SiNx).

A semiconductor layer 131 is formed in a predetermined region on the buffer layer 312. Then, a gate insulation film 314 is formed over substantially the entire upper surface of the pixel region 110 including the semiconductor layer 131. The semiconductor layer 131 includes source and drain regions, and a channel region.

A gate electrode 315 is formed on the gate insulation film 314 over the semiconductor layer 131. Then, an interlayer insulation film 316 is formed on substantially the entire upper surface including the gate electrode 315. The interlayer insulation film 316 and the gate insulation film 314 are patterned to form contact holes. Source and drain electrodes 317a and 317b are formed so that they can be connected to the semiconductor layer 313 through the contact hole.

The upper surface of the resulting structure is planarized using an overcoat 320. Then, a via hole is formed through the overcoat 320. An anode electrode 319 is formed over the overcoat 320. The anode electrode 319 is connected with the source and drain electrodes 317a and 317b through the via hole.

A pixel definition layer 320 is formed on the overcoat 320, and is patterned to expose some portion of the anode electrode 319. Then, an organic thin film layer 321 is formed to cover the exposed portion of the anode electrode 319. A cathode electrode 322 is formed on the pixel definition layer 320, covering the organic thin film layer 321.

Figure 4A:
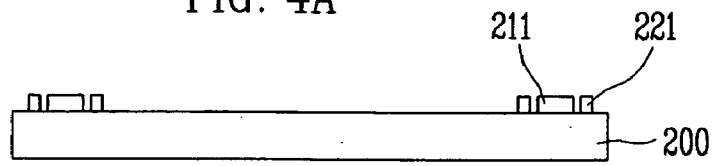
FIG. 4A to FIG. 4E are cross-sectional views showing a method for manufacturing an organic light emitting display device according to one embodiment.

Referring to FIG. 4A, a sealing substrate 200 is prepared to have a suitable size so that it can be overlapped with the pixel region 110 and a portion of the non-pixel region 120. The sealing substrate 200 may be formed of a transparent materials such as glass. In other embodiments, the sealing substrate 200 includes silicon oxide (SiO$_2$).

Figure 5:
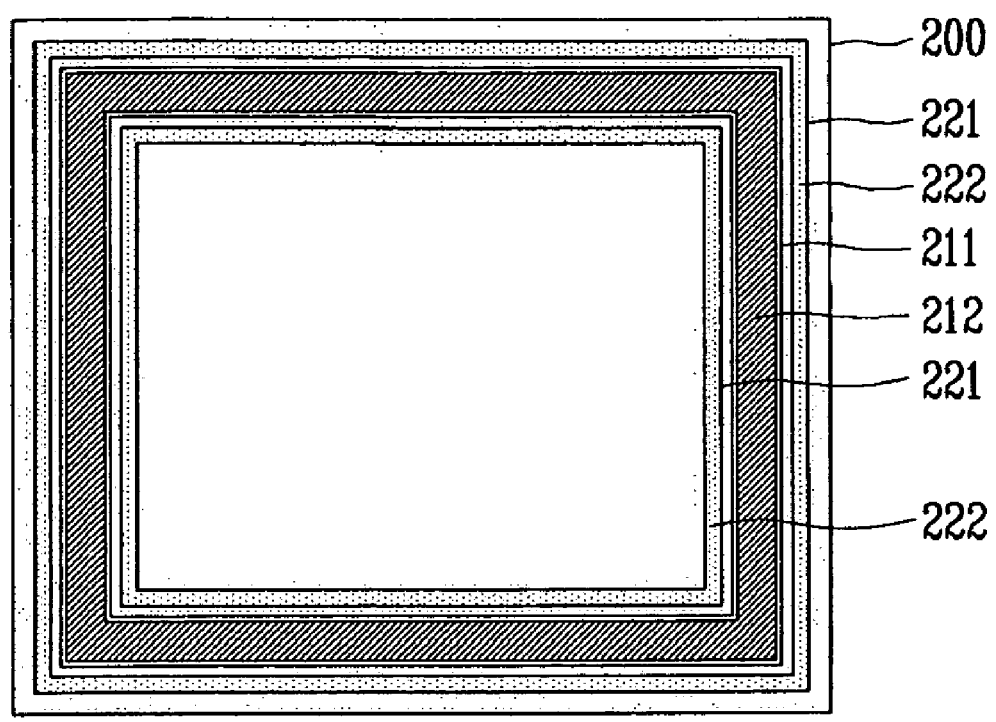
FIG. 5 is a plan view of the organic light emitting display device of FIG. 4A to FIG. 4E.

A first transparent glass layer 211 and a second transparent glass layer 221 are formed on the sealing substrate 200. Then, the layers 211, 221 are sintered at a temperature of about 450° C. to about 600° C. The first and second transparent glass layers 211 and 221 are configured to block moisture or oxygen from entering the pixel region 110. In one embodiment, the layers 211, 221 have a height of about 5 to about 100 μm. The layers 211, 221 are formed along an edge of the sealing substrate 200 to surround the pixel region 110 and a portion of the non-pixel region 120, as shown in FIG. 5. In the illustrated embodiment, the second transparent glass layer 221 is formed in both inside and outside of the first transparent glass layer 211. In other embodiments, the second transparent glass layer may be formed only either inside or outside of the first transparent glass layer 211.

Figure 4B:
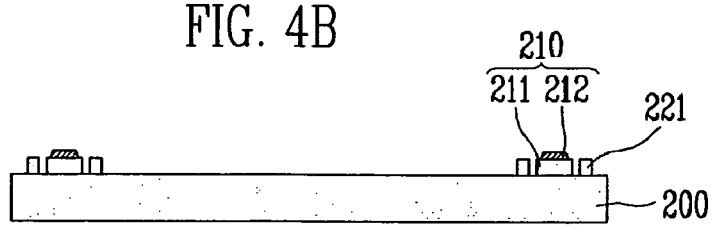

Referring to FIG. 4B, an opaque glass layer 212 is formed on the first transparent glass layer 211, and then is sintered. The opaque glass layer 212 is formed of a material that can be melted using a laser or an infrared ray. The material may include a frit containing at least one transition metal dopant. The opaque glass layer 212 has a lower height and a narrower width than the first transparent glass layer 211. For example, the opaque glass layer 212 has a height of about 3 to about 30 μm. It may be formed in a rectangular shape having the same widths in lower and upper portions, or in a trapezoid shape having about 60 to about 100% of a top width when compared to a bottom width.

Figure 4C:
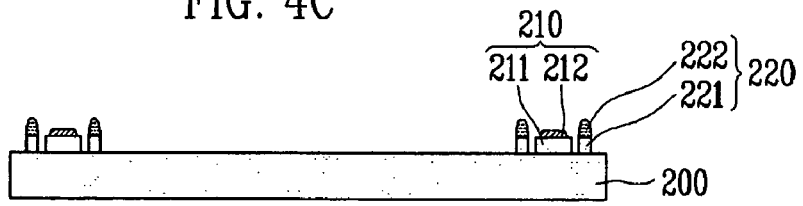

Referring to FIG. 4C, a reinforcement material 222 having a lower height than the second transparent glass layer 221 is applied onto the second transparent glass layer 221. The application of the second transparent glass layer 221 may be conducted using a screen printing or dispensing method. The reinforcement material 222 may have a height of about 3 to about 50 μm. The reinforcement material 222 has good adhesion to the substrate 100. The reinforcement material 222 may be formed of a material that may relieve impacts applied from the outside and prevent oxygen, hydrogen, or moisture from inflicting the array of pixels. For example, the reinforcement material is formed of a material that may be self-cured, or cured using heat or an ultraviolet ray. Examples of the reinforcement material include, but are not limited to, epoxy.

Figure 4D:
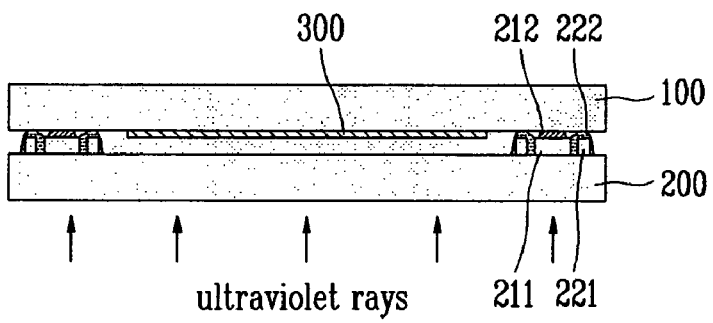

Referring to FIG. 4D, the sealing substrate 200 is bonded to the substrate 100 so that it can be overlapped with the pixel region 110 and a portion of the non-pixel region 120. The reinforcement material 222 is cured by irradiating an ultraviolet ray, etc. while the opaque glass layer 212 and the reinforcement material 222 are closely adhered to the substrate 100. The ultraviolet ray used for curing the reinforcement material 222, etc. may be irradiated on the back surface of the sealing substrate 200. The reinforcement material 222 is pressed when the sealing substrate 200 and the substrate 100 are bonded to each other. Thus, the opaque glass layer 212 and the reinforcement material 222 are closely bonded to the substrate 100. An interface between the reinforcement material 222 and the substrate 100 is enlarged, and simultaneously a gap between the first transparent glass layer 211 and the second transparent glass layer 221 is filled with the reinforcement material 222, improving its reinforcement efficiency. The reinforcement material 222 may not be injected between the opaque glass layer 212 and the substrate 100.

Figure 4E:
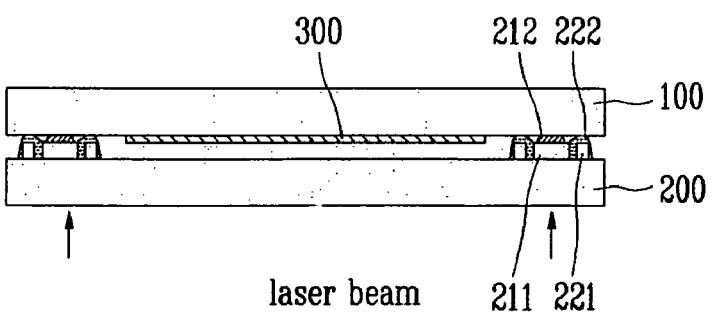

Referring to FIG. 4E, the opaque glass layer 212 is adhered to the substrate 100 by irradiating a laser or an infrared ray along the first transparent glass layer 211 onto the back surface of the sealing substrate 200. The opaque glass layer 212 is melted and connected to the substrate since the heat is generated when the laser or the infrared ray irradiated through the first transparent glass layer 211 is absorbed into the opaque glass layer 212.

The laser is irradiated at a power of about 36 to about 38 W, and the laser or infrared ray is moved along the first transparent glass layer 211 at a constant speed so as to provide a constant melting temperature and an adhesive force. The laser or infrared ray is moved at a speed of about 10 to about 30 mm/sec, optionally approximately about 20 mm/sec.

In another embodiment, the process for irradiating an ultraviolet ray, etc. in order to cure the reinforcement material 222 and the process for irradiating a laser or an infrared ray in order to melt the opaque glass layer 212 to adhere to the substrate 100 may be switched in order.

Meanwhile, although it is described in this embodiment that the first and second encapsulating materials 210 and 220 are formed to encapsulate only a pixel region 100, the invention is not limited thereto, and the substrates may enclose a scan drive unit 130 or other elements. In this case, a size of the sealing substrate 200 varies accordingly.

Also, although it is described that the first and second encapsulating materials 210 and 220 are formed on the sealing substrate 200, the invention is not limited thereto. The materials may be formed on the substrate 100. The numbers and the positions of the first transparent glass layer 211 and the opaque glass layer 212 that constitute the first encapsulating material 210, and the second transparent glass layer 221 and the reinforcement material 222 that constitute the second encapsulating material 220 may be also varied accordingly.

According to embodiments, a gap between the substrate 100 and the sealing substrate 200 may be easily adjusted by changing the heights of the first and second transparent glass layers 211 and 221. Accordingly, a gap between the substrate 100 and the sealing substrate 200 can be maintained so as to prevent Newton's rings from occurring.

As described above, the organic light emitting display device of the embodiments prevents Newton's rings from occurring by adjusting the height of the transparent glass layer. Also, the organic light emitting display device of the embodiments may employ a low energy laser or an infrared ray because the sealing structure has a thin opaque glass layer and reinforcement layer applied onto a transparent glass layer. Accordingly, the substrate may be free of damages due to a stress which may be caused by a high power laser or infrared ray. The organic light emitting element may be safely protected from impacts, and moisture or oxygen from the outside by using the reinforcement material.

The description proposed herein is just an example for the purpose of illustrations only, and is not intended to limit the scope of the invention. It should be understood that other equivalents and modifications could be made thereto without departing from the spirit and scope of the invention.

What is claimed is:
1. An organic light emitting display device comprising:
a first substrate;
a second substrate arranged over the first substrate;
an array of organic light emitting pixels interposed between the first and second substrates;
a frit seal interposed between the first and second substrates while surrounding the array; and
a reinforcing structure interconnecting the first and second substrates, the reinforcing structure comprising a first portion connecting to the first substrate and a second portion connecting to the second substrate, wherein the first and second portions are made of different materials;
wherein the frit seal comprises a first portion connecting to the first substrate and a second portion connecting to the second substrate, wherein the first portion of the frit seal is substantially opaque, and wherein the second portion of the frit seal is substantially transparent.

2. The device of claim 1, wherein the device is configured to display images on the second substrate, and wherein the second portion of the reinforcing structure is substantially transparent.

3. The device of claim 2, wherein the second portion of the reinforcing structure is made of substantially the same material as the frit seal.

4. The device of claim 2, wherein the second portion of the reinforcing structure is made of a frit material.

5. The device of claim 1, wherein the array is formed on the first substrate, and wherein the first portion of the reinforcing structure is substantially opaque.

6. The device of claim 5, wherein the first portion of the reinforcing structure comprises a resin.

7. The device of claim 5, wherein the first portion of the reinforcing structure is made of a non-frit material.

8. The device of claim 1, wherein the first portion of the reinforcing structure is substantially opaque and has a height in a direction perpendicular to a display surface of the device, and wherein the height is from about 3 to about 50 µm.

9. The device of claim 1, wherein the second portion of the reinforcing structure is substantially transparent and has a height in a direction perpendicular to a display surface of the device, and wherein the height is from about 5 to about 100 µm.

10. The device of claim 1, wherein the reinforcing structure substantially surrounds the frit seal.

11. The device of claim 1, wherein the frit seal surrounds the reinforcing structure.

12. The device of claim 11, wherein the frit seal contacts the reinforcing structure.

13. The device of claim 11, wherein the frit seal and the reinforcing structure form a gap therebetween, and wherein the gap extends along the frit seal while surrounding the array.

14. The device of claim 1, wherein the reinforcing structure surrounds the array.

15. The device of claim 14, wherein the frit seal surrounds the reinforcing structure, and wherein the device further comprises another reinforcing structure substantially surrounding the frit seal while interconnecting the first and second substrates.

16. The device of claim 15, wherein the other reinforcing structure comprises a first portion connecting to the first substrate and a second portion connecting to the second substrate, and wherein the first portion is substantially opaque.

17. The device of claim 16, wherein the second portion of the other reinforcing structure is substantially transparent.

18. The device of claim 1, wherein the first portion of the frit seal has a first thickness, wherein the second portion of the frit seal has a second thickness, wherein the first and second thicknesses are measured in a direction parallel to a display surface of the device, and wherein the second thickness is greater than the first thickness.

19. The device of claim 1, wherein the frit seal comprises one or more materials selected from the group consisting of magnesium oxide (MgO), calcium oxide (CaO), barium oxide (BaO), lithium oxide ($Li_2O$), sodium oxide ($Na_2O$), potassium oxide ($K_2O$), boron oxide ($B_2O_3$), vanadium oxide ($V_2O_5$), zinc oxide (ZnO), tellurium oxide ($TeO_2$), aluminum oxide ($Al_2O_3$), silicon dioxide ($SiO_2$), lead oxide (PbO), tin oxide (SnO), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide (CuO), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, and borosilicate.

20. A method of making an organic light emitting display device, the method comprising:
   providing a first substrate, an array of organic light emitting pixels and a second substrate, wherein the array is formed on the first substrate;
   arranging and interconnecting the first and second substrates with a frit such that the first substrate, the second substrate and the frit form an enclosed space and that the frit surrounds the array; and
   forming a reinforcing structure interconnecting the first and second substrates, the reinforcing structure comprising a first portion connecting to the first substrate and a second portion connecting to the second substrate, wherein the first portion is substantially opaque, and wherein the first and second portions are made of different materials, and
   wherein the frit seal comprises a first portion connecting to the first substrate and a second portion connecting to the second substrate, wherein the first portion of the frit seal is substantially opaque, and wherein the second portion of the frit seal is substantially transparent.

21. The method of claim 20, wherein forming the reinforcing structure comprises:
   forming the second portion on the second substrate using a frit material; and
   forming a first portion between the second portion and the first substrate such that the first portion bonds to the first substrate and the second portion.

22. The method of claim 21, wherein forming the first portion comprises:
   forming a resin on the second portion;
   interposing the resin between the first substrate and the second portion; and
   plasticizing at least part of the resin and then solidifying the resin so as to bond the resin to the first substrate.

23. The method of claim 21, wherein forming the first portion comprises forming a material for the first portion on the second portion using screen printing or nozzle dispensing of the material.

* * * * *